(12) United States Patent
Fujihara

(10) Patent No.: US 11,269,004 B2
(45) Date of Patent: Mar. 8, 2022

(54) INSPECTION APPARATUS AND INSPECTION METHOD FOR INSPECTING ELECTRICAL CHARACTERISTIC OF ELECTRONIC DEVICE

(71) Applicant: Tokyo Electron Limited, Tokyo (JP)

(72) Inventor: Jun Fujihara, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 172 days.

(21) Appl. No.: 16/575,552

(22) Filed: Sep. 19, 2019

(65) Prior Publication Data

US 2020/0096557 A1    Mar. 26, 2020

(30) Foreign Application Priority Data

Sep. 20, 2018 (JP) .............................. JP2018-176444

(51) Int. Cl.
*G01R 31/28* (2006.01)

(52) U.S. Cl.
CPC ..... *G01R 31/2849* (2013.01); *G01R 31/2831* (2013.01)

(58) Field of Classification Search
CPC ............ G01R 31/2893; G01R 31/2891; G01R 31/2887; G01R 31/2874; G01R 1/07342; G01R 1/0416; G01R 31/26; G01R 31/2849; G01R 31/2831; G01R 31/2886; G01R 31/2863; G01R 31/2889; G01R 31/2642; G01R 31/2875; G01R 31/2862; G01R 1/0408; G01R 1/067; G01R 1/06711; G01R 1/06777; G01R 1/07307; G01R 1/44;
(Continued)

(56) References Cited

U.S. PATENT DOCUMENTS 6,032,724 A * 3/2000 Hatta ................. H01L 21/67103
165/80.2
6,111,421 A * 8/2000 Takahashi .......... G01R 31/2868
324/750.04
(Continued)

FOREIGN PATENT DOCUMENTS

JP      2003-273176 A    9/2003
JP      2017-028296 A    2/2017
(Continued)

*Primary Examiner* — Vinh P Nguyen
(74) *Attorney, Agent, or Firm* — Pearne & Gordon LLP

(57) ABSTRACT

An inspection apparatus configured to inspect a target object includes a placing device configured to place the target object thereon; a heater provided in the placing device and configured to adjust a temperature of the placing device; and a position adjusting mechanism configured to hold the placing device on which the target object is placed, and configured to perform a position adjustment between the target object placed on the placing device and a terminal to be brought into contact with the target object when an inspection of an electrical characteristic is performed. The placing device is configured to be separated from the position adjusting mechanism when the inspection of the electrical characteristic is performed. A heat sink having prominences and depressions is provided at a portion of the placing device except a holding target portion thereof which is to be held by the position adjusting mechanism.

9 Claims, 6 Drawing Sheets

(58) Field of Classification Search
CPC ........ G01R 31/318533; G01R 31/2868; H01L 21/67011; H01L 22/34; H01L 21/67242; H01L 21/66; H01L 22/14; H01L 21/67248; H01L 21/67098; H01L 21/67259; H01L 22/12; H01L 22/30; H04L 43/50
See application file for complete search history.

(56) References Cited

U.S. PATENT DOCUMENTS

| | | | | |
|---|---|---|---|---|
| 6,583,638 | B2 * | 6/2003 | Costello | H01L 21/67109 |
| | | | | 324/750.09 |
| 7,812,627 | B2 * | 10/2010 | Yamamoto | G01R 31/2875 |
| | | | | 324/750.05 |
| 10,416,229 | B2 * | 9/2019 | Yamada | H01L 21/68 |
| 10,823,778 | B2 * | 11/2020 | Akiyama | G01R 31/2877 |

FOREIGN PATENT DOCUMENTS

| | | |
|---|---|---|
| KR | 10-2000-0038694 A | 7/2000 |
| KR | 10-2009-0130272 A | 12/2009 |

\* cited by examiner

INSPECTION APPARATUS AND INSPECTION METHOD FOR INSPECTING ELECTRICAL CHARACTERISTIC OF ELECTRONIC DEVICE

CROSS-REFERENCE TO RELATED APPLICATION

This application claims the benefit of Japanese Patent Application No. 2018-176444 filed on Sep. 20, 2018, the entire disclosure of which is incorporated herein by reference.

TECHNICAL FIELD

The various aspects and embodiments described herein pertain generally to an inspection apparatus and an inspection method.

BACKGROUND

Patent Document 1 describes an inspection apparatus equipped with a placing table configured to place a semiconductor wafer (hereinafter, simply referred to as "wafer") and a probe card configured to hold probes for characteristic measurement. These probes for characteristic measurement are brought into contact with the wafer to measure characteristic data of a device from the wafer. This inspection apparatus also has probes for temperature measurement held by the probe card. These probes for temperature measurement are brought into contact with the wafer to measure temperature data from the wafer. Further, the inspection apparatus is equipped with a temperature control mechanism configured to control a temperature of the placing table such that a measurement temperature measured by the probes for the temperature measurement coincides with a set temperature. In this inspection apparatus, inspection of the characteristics of the device is performed based on the characteristic data measured by the probes for the characteristic measurement in the state that the temperature of the placing table is controlled to be equal to the set temperature.

Patent Document 1: Japanese Patent Laid-open Publication No. 2003-273176

SUMMARY

In one exemplary embodiment, an inspection apparatus configured to inspect a target object includes a placing device configured to place the target object thereon; a heater provided in the placing device and configured to adjust a temperature of the placing device; and a position adjusting mechanism configured to hold the placing device on which the target object is placed, and configured to perform a position adjustment between the target object placed on the placing device and a terminal to be brought into contact with the target object when an inspection of an electrical characteristic is performed. The placing device is configured to be separated from the position adjusting mechanism when the inspection of the electrical characteristic is performed. A heat sink having prominences and depressions is provided at a portion of the placing device except a holding target portion thereof which is to be held by the position adjusting mechanism.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
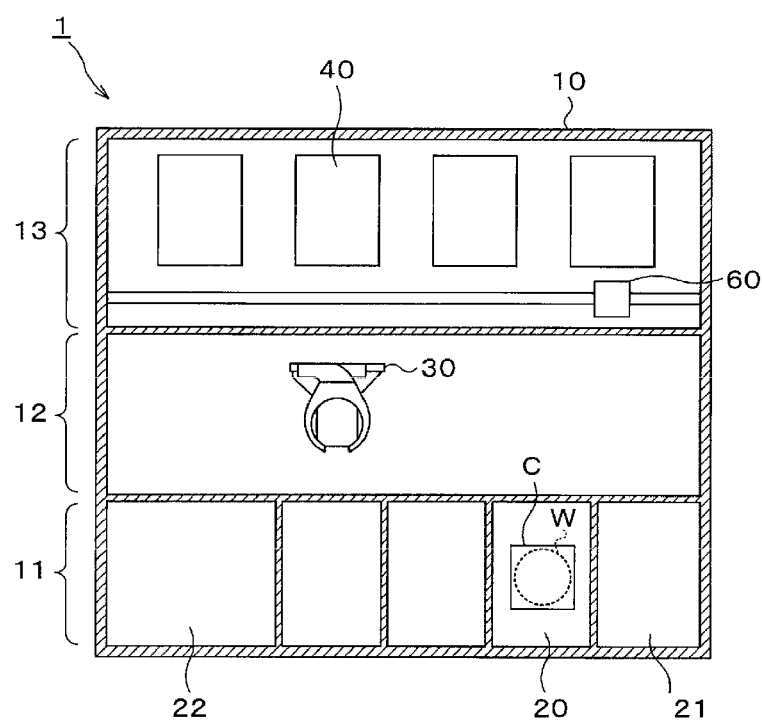
FIG. 1 is a transversal cross sectional top view illustrating a schematic configuration of an inspection apparatus according to an exemplary embodiment.
Figure 1:
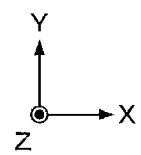

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

In a semiconductor manufacturing process, a multiple number of electronic devices having a preset circuit pattern are formed on a wafer. Inspection of electrical characteristics is performed on these electronic devices so that the electronic devices are sorted into fine goods and inferior goods. This inspection of the electronic devices is performed by using an inspection apparatus in a wafer state before the electronic devices are separated.

The inspection apparatus for the electronic devices, which is also called a prober or the like, is equipped with a probe card having a multiple number of probes. Based on electrical signals from the electronic devices which are detected through the probes, it is determined whether or not the electronic devices are inferior goods.

Recently, to enable the inspection of the electrical characteristics of the electronic devices under various temperature conditions, a temperature adjusting mechanism may be provided in a placing device on which the wafer is placed, as in the inspection apparatus described in Patent Document 1.

In general, only a heating device may be provided as such a temperature adjusting mechanism provided in the placing device, since a cooling device using a liquid coolant is of a high price.

Recently, however, a heat generation rate is high when the electronic device is operated. Further, since the density of the electronic devices is increased, the heat generation rate is also increased when the multiple number of electronic devices are inspected at once.

If the heat generation rate is high as stated above, a temperature of the placing table may not be appropriately adjusted during the inspection if only the heating device is used as the temperature control mechanism for the placing table. Particularly, in a configuration in which a position adjusting mechanism configured to perform a position adjustment between the wafer placed in the placing device and the probes is separated from the placing device when the inspection is performed, it may be difficult to adjust the temperature of the placing table to a set temperature during the inspection if the heat generation rate of the electronic devices is high as stated above. This is because the heat of the electronic devices cannot be dissipated to the position adjusting mechanism via the placing device, and enough heat capacity cannot be obtained only with the placing device.

In view of the foregoing, the present disclosure is directed to a technique capable of adjusting the temperature of the placing device appropriately without using a high-price device even in case that the heat generation rate of the electronic devices is high when inspecting the electrical characteristics of the electronic devices with the inspection apparatus in which the position adjusting mechanism and the placing device are separated while the inspection is performed.

Now, an inspection apparatus and an inspection method according to an exemplary embodiment will be described with reference to the accompanying drawings. In the specification and the drawings, parts having substantially same functions and configurations will be assigned same reference numerals, and redundant description thereof will be omitted.

Figure 2:
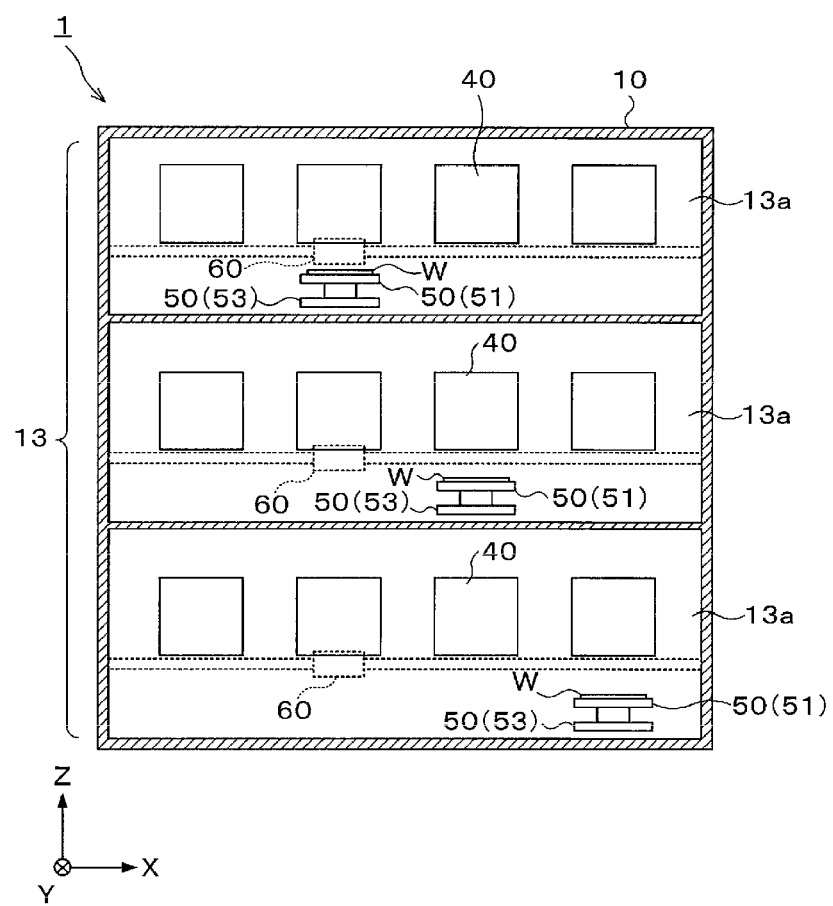
FIG. 2 is a longitudinal cross sectional front view illustrating the schematic configuration of the inspection apparatus according to the exemplary embodiment.

FIG. 1 and FIG. 2 are a transversal cross sectional top view and a longitudinal cross sectional front view illustrating a schematic configuration of the inspection apparatus according to the exemplary embodiment.

As depicted in FIG. 1 and FIG. 2, an inspection apparatus 1 has a housing 10, and the housing 10 has a carry-in/out section 11, a transfer section 12 and an inspection section 13. The carry-in/out section 11 is a region where a wafer W as an inspection target object is carried into/from the inspection apparatus 1. The transfer section 12 connects the carry-in/out section 11 and the inspection section 13. The inspection section 13 is a region where an inspection of an electrical characteristic of a semiconductor device formed on the wafer W is performed.

The carry-in/out section 11 is equipped with: a port 20 configured to receive a cassette C accommodating a multiple number of wafers W therein; a loader 21 configured to accommodate therein a probe card to be described later; and a controller 22 configured to control individual components of the inspection apparatus 1. The controller 22 is implemented by a computer including, for example, a CPU, a memory, and so forth, and is equipped with a program storage (not shown). The program storage stores therein programs for controlling various kinds of processings performed in the inspection apparatus 1. Further, the programs may be recorded on a computer-readable recording medium and installed from this recording medium to the controller 22.

Provided in the transfer section 12 is a transfer device 30 configured to be freely movable while holding the wafer W or the like. This transfer device 30 transfers the wafer W between the cassette C within the port 20 of the carry-in/out section 11 and the inspection section 13. Further, the transfer device 30 transfers, among probe cards provided at a pogo frame within the inspection section 13 to be described later, a probe card in need of maintenance to the loader 21 of the carry-in/out section 11. Further, the transfer device 30 transfers a new probe card or the probe card after being subjected to the maintenance from the loader 21 to the aforementioned pogo frame within the inspection section 13.

The inspection section 13 is equipped with a plurality of testers 40. To elaborate, the inspection section 13 is divided in three division sections 13a in the vertical direction, as shown in FIG. 2, and rows of four testers 40, which are arranged in the horizontal direction (X direction of the drawing), are arranged in each division section 13a. Further, one position adjusting device 50 and one camera 60 are provided in each of the division sections 13a. Here, however, the number and the layout of the testers 40, the position adjusting devices 50 and the cameras 60 may be selected as required.

The tester 40 is configured to output/receive the electrical signal for inspection of the electrical characteristic to/from the wafer W.

The position adjusting device 50 is configured to place the wafer W thereon and performs a position adjustment between the wafer W placed thereon and the probe card disposed under the tester 40. The position adjusting device 50 is configured to be movable in a region under the tester 40.

The camera 60 is configured to be movable horizontally and is placed in front of each of the testers 40 within the division section 13a where the corresponding camera 60 is provided. The camera 60 is configured to image a positional relationship between the probe card disposed under the tester 40 and the wafer W placed on the position adjusting device 50.

In this inspection apparatus 1, while the transfer device 30 is transferring the wafer W toward one tester 40, another tester 40 is capable of performing the inspection of the electrical characteristic of the semiconductor device formed on another wafer W.

Figure 3:
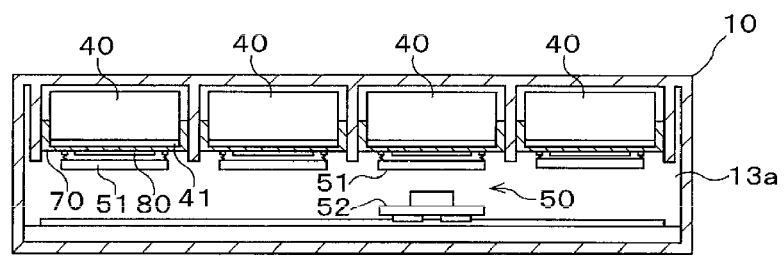
FIG. 3 is a longitudinal cross sectional front view illustrating an internal configuration of each division section.
Figure 4:
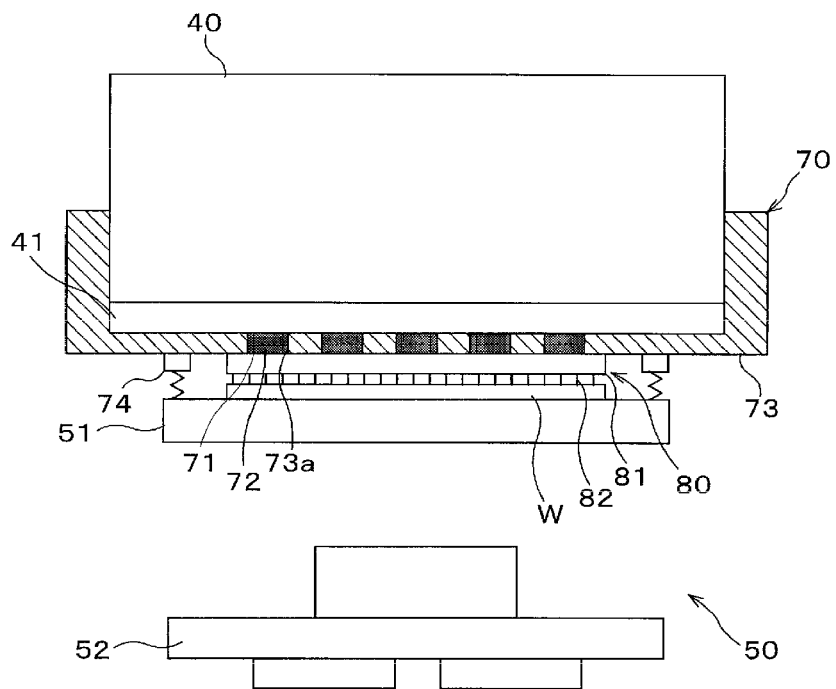
FIG. 4 is a partially enlarged view of FIG. 3.

Now, referring to FIG. 3 and FIG. 4, a configuration of the tester 40 and the position adjusting device 50 will be explained. FIG. 3 is a longitudinal cross sectional front view illustrating a configuration within the division section 13a. FIG. 4 is a partially enlarged view of FIG. 3.

The tester 40 has a tester motherboard 41, which is horizontally disposed, at a bottom thereof, as depicted in FIG. 3 and FIG. 4. The tester motherboard 41 is equipped with a non-illustrated plurality of inspection circuit boards which are mounted thereto in a standing posture. Further, a multiple number of electrodes is provided on a bottom surface of the tester motherboard 41.

Further, one pogo frame 70 and one probe card 80 are disposed under the tester 40 in this sequence from the top.

The pogo frame 70 is configured to support the probe card 80, and is disposed between the tester 40 and the probe card 80 to connect the probe card 80 and the tester 40 electrically. This pogo frame 70 has pogo pins 71 configured to connect the tester 40 and the probe card 80 electrically. To be specific, the pogo frame 70 includes: pogo blocks 72 each of which holds a multiple number of pogo pins 71; and a frame main body 73 having holes 73a in which the pogo blocks 72 are fitted so that the pogo pins 71 are mounted to the frame main body 73.

The probe card 80 is held on a bottom surface of the pogo frame 70 by vacuum attraction after being positioned at a preset position.

Further, a vertically extending bellows 74 is fastened to the bottom surface of the pogo frame 70 to surround the probe card 80. The bellows 74 is configured to form a sealed space including the probe card 80 and the wafer W while the wafer W on a chuck top to be described later is brought into contact with probes of the probe card 80 to be described later.

Further, a lower end of each pogo pin 71 of the pogo frame 70 is in contact with a corresponding electrode pad on a top surface of a card main body of the probe card 80 to be described later by a vacuum-attracting force acting on the pogo frame 70 and the probe card 80 with an evacuating device (not shown). Further, an upper end of each pogo pin 71 is pressed against a corresponding electrode on a bottom surface of the tester motherboard 41 by this vacuum-attracting force.

The probe card 80 has a circular plate-shaped card main body 81, a plurality of electrode pads (not shown) provided on a top surface of the card main body 81 and a plurality of needle-shaped probes 82 (terminals) extending downwards from a bottom surface of the card main body 81. Each of the plurality of electrodes provided on the top surface of the card main body 81 is electrically connected with the corresponding probe 82. Further, each probe 82 comes into contact with an electrode pad or a solder bump of the electronic device formed on the wafer W. Accordingly, when the inspection of the electrical characteristic is performed, an electrical signal for the inspection is output/received between the tester mother board 41 and the electronic device on the wafer W via the pogo pin 71, the electrode provided on the top surface of the card main body 81 and the probe 82.

The position adjusting device 50 is configured to place a chuck top 51 as the placing device thereon. The chuck top 51 is configured to place the wafer W thereon and hold the placed wafer W by attraction or the like.

Further, the position adjusting device 50 is equipped with an aligner 52. The aligner 52 is configured to be capable of holding, by vacuum attraction or the like, the chuck top 51 on which the wafer W is placed, and is configured as a position adjusting mechanism configured to perform a position adjustment between the probe 82 and the wafer W placed on the chuck top 51 when the inspection of the electrical characteristic is performed. This aligner 52 is configured to be movable in an up-and-down direction (Z direction of the drawing), a forward-backward direction (Y direction of the drawing) and a left-right direction (X direction of the drawing) while holding the chuck top 51.

With the wafer W placed on the chuck top 51 and the probe 82 of the probe card 80 brought into contact with each other through the position adjustment of the position adjusting device 50, the sealed space including the probe card 80 and the wafer W is formed, and this sealed space is evacuated by the evacuating device (not shown). At this time, by releasing the holding of the chuck top 51 by the aligner 52 and moving the aligner 52 downwards, the chuck top 51 is separated from the aligner 52 to be attracted to and held by the pogo frame 70. In this state, the inspection of the electrical characteristic is performed.

Figure 5:
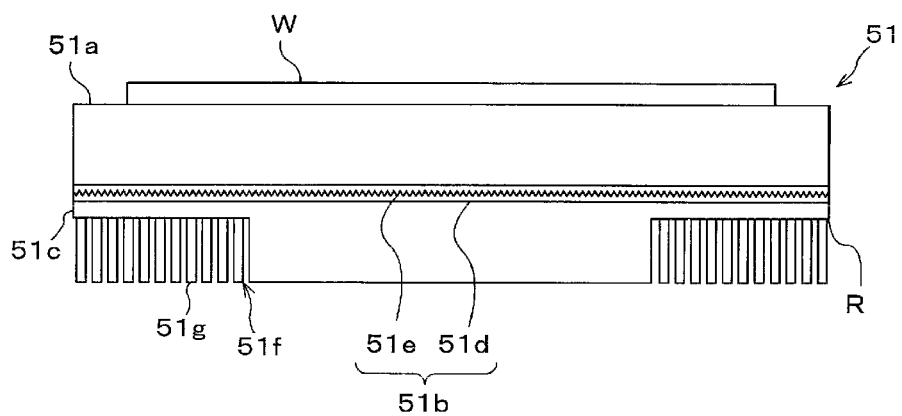
FIG. 5 is a side view of a chuck top.
Figure 6:
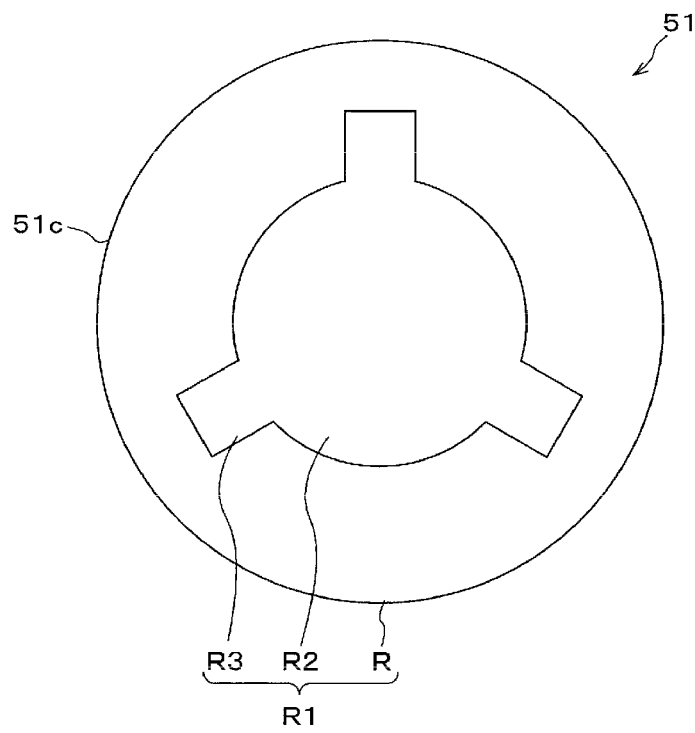
FIG. 6 is a rear view of the chuck top.

The chuck top 51 will be further elaborated. FIG. 5 is a side view of the chuck top 51, and FIG. 6 is a rear view of the chuck top 51. In FIG. 6, illustration of a heat sink to be described later or the like is omitted.

The chuck top 51 has, as illustrated in FIG. 5, a chuck top main body 51a, a mica heater 51b as a heater, and a pressing member 51c.

The chuck top main body 51a is a circular plate-shaped member, and the wafer W is placed on a top surface thereof. When viewed from the top, a diameter of the chuck top main body 51a is larger than a diameter of the wafer W. For example, the chuck top main body 51a has a diameter of 400 mm.

The mica heater 51b is a flat heater composed of a mica plate 51d and a heating body 51e embedded therein. When viewed from the top, the heating body 51e is disposed to have a substantially uniform density. Further, the mica heater 51b has a thickness of, e.g., 1 mm or less.

The pressing member 51c is a member configured to press the mica heater 51b with respect to the chuck top main body 51a and is fixed to the chuck top main body 51a by using, for example, a screw.

Further, the chuck top 51 is provided with a temperature sensor (not shown). For example, the temperature sensor is embedded in the chuck top main body 51a.

The heating body 51e of the mica heater 51b heats the chuck top 51 such that a measurement result obtained by the temperature sensor coincides with a set temperature, that is, such that the temperature of the chuck top 51 reaches the set temperature. Further, a temperature sensor configured to measure the temperature of the wafer W on the chuck top 51 or the electronic device formed on the wafer W may be provided, and the heating body 51e may heat the chuck top 51 such that the temperature of the wafer W or the electronic device reaches the set temperature.

In the inspection apparatus 1, by using the mica heater 51b or the like, the temperature of the chuck top 51 or the temperature of the wafer W placed on the chuck top 51 can be adjusted to, e.g., 25° C. to 130° C.

The pressing member 51c of the chuck top 51 has a heat sink 51f having prominences and depressions with a large surface area. The heat sink 51f is provided at a region of the pressing member 51c except a holding target region which is to be held by the aligner 52.

To elaborate, the pressing member 51c is provided with the heat sink 51f at a heat sink formation region R on a rear surface of the pressing member 51c opposite to the wafer W.

As illustrated in FIG. 6, for example, the heat sink formation region R is a region left if a circular central region R2 and three rectangular adjustment regions R3 adjacent of the central region R2 are removed from an entire region R1 of the rear surface of the pressing member 51c, when viewed from the top. The central region R2 is a region to which the aligner 52 is attracted when the chuck top 51 is held by the aligner 52. Further, each adjustment region R3 is a region for adjusting a positional relationship between the chuck top 51 and the aligner 52. By way of example, a reflecting member is provided at the adjustment region R3, and a light emitting device configured to emit light to the reflecting member and a sensor configured to receive reflection light from the reflecting member are provided at a region of the aligner 52 facing the adjustment region R3. As another example, the light emitting device and the sensor may be provided at the adjustment region R3, and the reflection member may be provided at the region of the aligner 52 facing the adjustment region R3.

The heat sink 51f has a multiple number of column-shaped members 51g extending in the up-and-down direction to be thus provided with the prominences and the depressions. In the example of FIG. 5, the column-shaped members 51g are arranged to have a substantially uniform density in the heat sink formation region R on the rear surface of the pressing member 51c. Each column-shaped member 51g may have a cylindrical shape, a prism shape or a spindle shape.

The pressing member 51c having this heat sink 51f and the chuck top main body 51a may be made of, by way of example, but not limitation, aluminum.

Here, the chuck top 51 has only the heat sink 51f as a device for cooling the corresponding chuck top 51, and is not provided with the high-price cooling device using the liquid coolant or the like.

Figure 7:
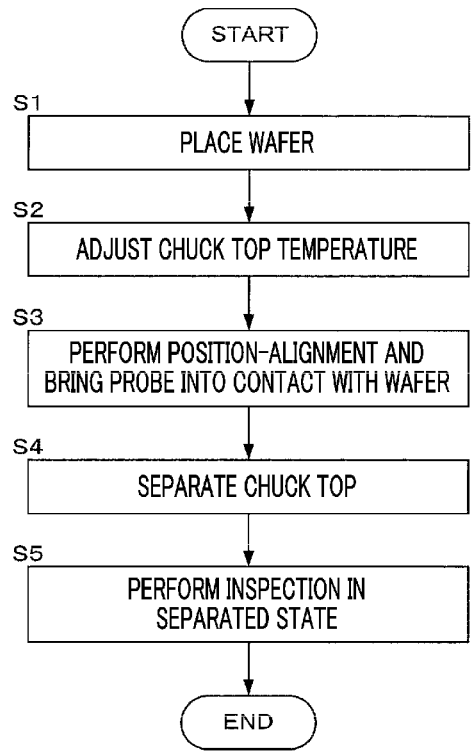
FIG. 7 is a flowchart for describing an example of an inspection processing using the inspection apparatus according to the exemplary embodiment.

Now, an inspection processing using the inspection apparatus 1 will be described with reference to FIG. 7. FIG. 7 is a flowchart for describing an example of the inspection processing.

First, the transfer device 30 is controlled to take out the wafer W from the cassette C within the port 20 of the carry-in/out section 11 and carry the wafer W into the inspection section 13. Then, the wafer W is placed on the chuck top 51 which is held by the aligner 52 (process S1).

Then, the mica heater 51b is controlled to adjust the chuck top 51, which is held by the aligner 52 and holds the wafer W thereon, to have a set temperature (process S2).

Thereafter, the probes 82 of the probe card 80 are position-aligned with the temperature-adjusted wafer W on the chuck top 51 and brought into contact with the wafer W (process S3). To elaborate, the aligner 52 and the camera 60 are controlled to perform the position adjustment between the wafer W on the chuck top 51 and the probe card 80 in the horizontal direction. Then, the chuck top 51 is raised until the probes 82 of the probe card 80 and the electrodes of electronic devices formed on the wafer W come into contact with each other.

In the state that the electrodes on the wafer W are in contact with the probes 82, the evacuating device (not shown) or the like is controlled and the aligner 52 is lowered, so that the chuck top 51 is separated from the aligner 52 to be attracted to and held by the pogo frame 70 (process S4).

In the state that the chuck top 51 and the aligner 52 are separated from each other, the inspection of the electrical characteristic of the electronic device is performed while adjusting the temperature of the chuck top 51 to the set temperature (process S5). The electric signal for the inspection of the electrical characteristic is inputted from the tester 40 to the electronic device via the pogo pin 71, the probe 82, and so forth. The temperature adjustment of the chuck top 51 is mainly carried out by the heating with the mica heater 51b based on the measurement result of the temperature sensor provided in the chuck top 51 and the heat dissipation from the heat sink 51f provided at the rear surface of the chuck top 51.

Upon the completion of the inspection of the electrical characteristic, the aligner 52, the transfer device 30, and so forth are controlled to return the wafer W back into the cassette C within the port 20. Then, the series of the inspection processings are ended.

Further, while the inspection in the one tester 40 is being carried out, transfer of a wafer into another tester 40 and the reception of a wafer W from another tester 40 are performed by the aligner 52.

As stated above, in the present exemplary embodiment, the heat sink 51f having the prominences and the depressions is provided at the region of the chuck top 51 except the holding target region thereof to be held by the aligner 52. Therefore, even in the inspection of the electrical characteristic using the inspection apparatus 1 having the configuration in which the chuck top 51 and the aligner 52 are separated from each other, the heat from the electronic device formed on the wafer W on the chuck top 51 can be efficiently dissipated from the heat sink 51f. Further, as compared to the cooling device using the liquid coolant or the like, the heat sink 51f is of a low price. Therefore, in the inspection of the electrical characteristic using the inspection apparatus 1 in which the chuck top 51 and the aligner 52 are separated from each other, it is possible to adjust the temperature of the chuck top 51 to the set temperature without using the high-price device even in case that heat generation from the electronic device is high (e.g., 100 W).

Furthermore, in the present exemplary embodiment, a heat dissipation rate from the chuck top 51 is increased by providing the heat sink 51f. As a way to increase the heat dissipation rate from the chuck top 51, there may be considered two methods: increasing the diameter of the chuck top 51 and increasing a thickness of the chuck top 51.

However, to avoid a contact between the chuck top 51 and a structure adjacent to the chuck top 51 in the horizontal direction, a distance between the chuck top 51 and the structure needs to be set to be equal to or larger than a preset value. Thus, to increase the diameter of the chuck top 51, the size of the entire inspection apparatus 1 needs to be increased.

Besides, if the thickness of the chuck top 51 is increased, a weight of the chuck top 51 is also increased. In the configuration in which the chuck top 51 is separated from the aligner 52 for the inspection, however, it is not desirable that the weight of the chuck top 51 is increased.

In contrast, according to the present exemplary embodiment, the diameter or the thickness of the chuck top 51 need not be increased. Therefore, while suppressing a scale-up of the inspection apparatus 1, the inspection can be performed in the state that the chuck top 51 is separated from the aligner 52 and firmly attracted and held.

Furthermore, in the present exemplary embodiment, the heat sink 51f is composed of the column-shaped members 51g. Accordingly, even in case that a blowing device for the heat sink 51f is not provided, a high cooling effect can be obtained, as compared to a configuration in which the heat sink 51f is composed of a multiple number of flat plate-shaped members. Further, since the aforementioned blowing device is not required, the scale-up of the inspection apparatus 1 can be avoided.

In the above description, the heating body 51e of the mica heater 51b is disposed to have the substantially uniform density. Instead, however, when viewed from the top, the heating body 51e may be provided such that a density at a portion of the chuck top 51 where the heat sink 51f is formed is higher than a density at a portion of the chuck top 51 where the heat sink 51f is not formed. With this configuration, the temperature of the chuck top 51 can be more uniformed within the surface thereof.

In addition, in the above description, the column-shaped members 51g forming the heat sink 51f are arranged to have the uniform density. Instead, however, when viewed from the top, the density of the column-shaped members 51g at a portion of the chuck top 51 where the wafer W is to be placed may be higher than the density at a portion of the chuck top 51 where the wafer W is not to be placed. With this configuration, the temperature of the chuck top 51 can be more uniformed within the surface thereof.

Figure 8:
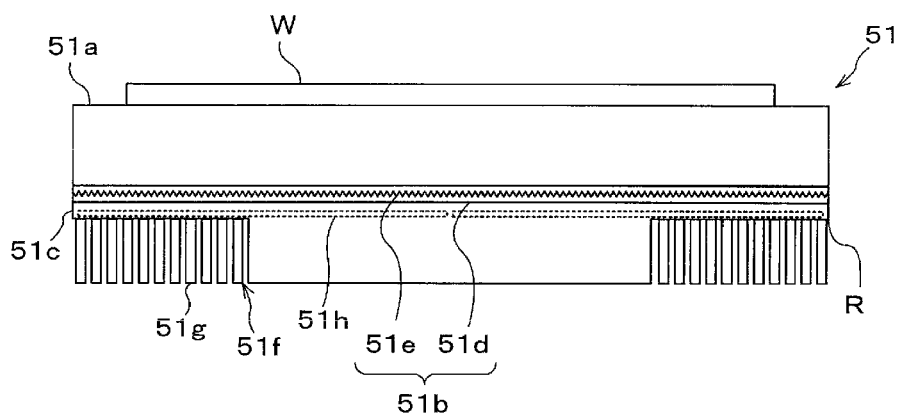
FIG. 8 is a side view showing another example of the chuck top.
Figure 9:
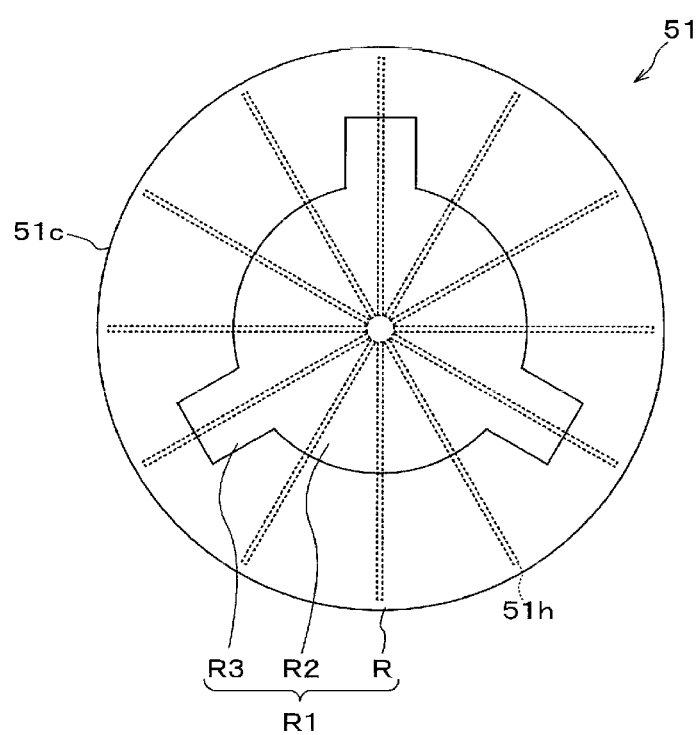
FIG. 9 is a rear view showing the another example of the chuck top.

FIG. 8 and FIG. 9 are diagrams showing another example of the chuck top 51. FIG. 8 is a side view of the chuck top 51 of another example, and FIG. 9 is a rear view thereof. In FIG. 9, illustration of the heat sink 51f is omitted.

The chuck top 51 of FIG. 8 has heat pipes 51h embedded therein. To elaborate, the heat pipes 51h are embedded within the pressing member 51c of the chuck top 51 to be located closer to the mica heater 51b than to the heat sink 51f. By way of non-limiting example, the heat pipes 51h are arranged in a radial shape, as shown in FIG. 9. Further, when viewed from the top, one end of each heat pipe 51h is located at a portion where the heat sink 51f is not formed, that is, the central region R2, and the other end of each heat pipe 51h is located at a portion where the heat sink 51f is formed, that is, in the heat sink formation region R. This heat pipe 51h is capable of transferring heat of the portion of the chuck top 51 where the heat sink is not provided to the heat sink formation portion with high efficiency. The other end of each heat pipe 51h may be connected to the heat sink 51f.

By providing the heat pipe 51h as stated above, it is possible to perform the appropriate temperature adjustment of the portion of the chuck top 51 where the heat sink 51f is not provided more securely.

The above-described exemplary embodiment is not meant to be anyway limiting. The exemplary embodiment can be changed and modified in various ways without departing from the scope of the present disclosure.

Further, the following configurations are also included within the technical scope of the present disclosure.

(1) An inspection apparatus configured to inspect a target object, comprising:

a placing device configured to place the target object thereon;

a heater provided in the placing device and configured to adjust a temperature of the placing device; and a position adjusting mechanism configured to hold the placing device on which the target object is placed, and configured to perform a position adjustment between the target object placed on the placing device and a terminal to be brought into contact with the target object when an inspection of an electrical characteristic is performed, wherein the placing device is configured to be separated from the position adjusting mechanism when the inspection of the electrical characteristic is performed, and a heat sink having prominences and depressions is provided at a portion of the placing device except a holding target portion thereof which is to be held by the position adjusting mechanism.

According to the above-described (1), the heat sink having the prominences and the depressions is provided at the region of the placing device except the holding target portion thereof to be held by the position adjusting mechanism. Therefore, even in the configuration in which the placing device and the position adjusting mechanism are separated from each other, the heat from the electronic device formed on the target object placed on the placing device can be efficiently dissipated from the heat sink. Therefore, in the inspection of the electrical characteristic using the inspection apparatus in which the placing device and the position adjusting mechanism are separated from each other, it is possible to adjust the temperature of the placing device appropriately without using the high-price device even in case that heat generation from the electronic device is high.

(2) The inspection apparatus as described in (1), wherein the placing device has only the heat sink as a cooling device configured to cool the placing device.

(3) The inspection apparatus as described in (1) or (2), wherein the heater is provided with a heating body which is disposed to have a higher density at a portion of the placing device where the heat sink is formed than a portion of the placing device where the heat sink is not formed, when viewed from the top.

According to the above-described (3), a temperature of the placing device can be more uniformed within a surface thereof.

(4) The inspection apparatus as described in any one of (1) to (3), wherein the heat sink includes a plurality of column-shaped members, and when viewed from the top, the column-shaped members are arranged such that a density of the column-shaped members at a portion of the placing device where the target object is to be placed is higher than a density of the column-shaped members at a portion of the placing device where the target object is not to be placed.

According to the above-described (4), a temperature of the placing device can be more uniformed within a surface thereof. Further, since the heat sink is composed of the column-shaped members, high cooling effect can be obtained while suppressing the scale-up of the inspection apparatus.

(5) The inspection apparatus as described in any one of (1) to (4), wherein the placing device has a heat pipe embedded therein, and when viewed from the top, one end of the heat pipe is located in a portion where the heat sink is not provided, and the other end of the heat pipe is located in a portion where the heat sink is provided.

According to the above-described (5), the temperature adjustment of the placing device including the portion where the heat sink is not provided can be performed more securely.

(6) An inspection method of inspecting a target object by using an inspection apparatus, wherein the inspection apparatus comprises:

a placing device configured to place the target object thereon;

a heater provided in the placing device; and a position adjusting mechanism configured to hold the placing device on which the target object is placed, and configured to perform a position adjustment between the target object placed on the placing device and a terminal to be brought into contact with the target object when an inspection of an electrical characteristic is performed, wherein the placing device is provided with a heat sink having prominences and depressions at a portion thereof except a holding target portion which is to be held by the position adjusting mechanism, and wherein the inspection method comprises:

adjusting a temperature of the placing device which is held by the position adjusting mechanism and holds the target object thereon;

adjusting a position of the terminal with respect to the temperature-adjusted target object placed on the placing device and bringing the terminal into connect with the target object;

separating the position adjusting mechanism and the placing device from each other while maintaining a state in which the target object and the terminal are in contact with each other; and inspecting the electrical characteristic while adjusting the temperature of the placing device in a state that the position adjusting mechanism and the placing device are separated from each other.

According to the exemplary embodiment, it is possible to adjust the temperature of the placing device appropriately without using the high-price device even in case that the heat generation rate of the electronic device is high when inspecting the electrical characteristic of the electronic device by using the inspection apparatus in which the placing device and the position adjusting mechanism are separated when the inspection is performed.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

I claim:

1. An inspection apparatus configured to inspect a target object, comprising:
   a placing device configured to place the target object thereon;
   a heater provided in the placing device and configured to adjust a temperature of the placing device; and
   a position adjusting mechanism configured to hold the placing device on which the target object is placed, and configured to perform a position adjustment between the target object placed on the placing device and a terminal to be brought into contact with the target object when an inspection of an electrical characteristic is performed,
   wherein the placing device is configured to be separated from the position adjusting mechanism when the inspection of the electrical characteristic is performed,
   a heat sink, including a plurality of column-shaped members which form prominences and depressions, is provided at a portion of the placing device except a holding target portion thereof which is to be held by the position adjusting mechanism, and
   each bottom surface of the column-shaped members is positioned at a same level as a bottom surface of the holding target portion.

2. The inspection apparatus of claim 1,
   wherein the placing device has only the heat sink as a cooling device configured to cool the placing device.

3. The inspection apparatus of claim 2,
   wherein the heater is provided with a heating body which is disposed to have a higher density at a portion of the placing device where the heat sink is formed than a portion of the placing device where the heat sink is not formed, when viewed from the top.

4. The inspection apparatus of claim 3,
   wherein when viewed from the top, the column-shaped members are arranged such that a density of the column-shaped members at a portion of the placing device where the target object is to be placed is higher than a density of the column-shaped members at a portion of the placing device where the target object is not to be placed.

5. The inspection apparatus of claim 4,
   wherein the placing device has a heat pipe embedded therein, and
   when viewed from the top, one end of the heat pipe is located in a portion where the heat sink is not provided, and the other end of the heat pipe is located in a portion where the heat sink is provided.

6. The inspection apparatus of claim 1,
   wherein the heater is provided with a heating body which is disposed to have a higher density at a portion of the placing device where the heat sink is formed than a portion of the placing device where the heat sink is not formed, when viewed from the top.

7. The inspection apparatus of claim 1,
   wherein when viewed from the top, the column-shaped members are arranged such that a density of the column-shaped members at a portion of the placing device where the target object is to be placed is higher than a density of the column-shaped members at a portion of the placing device where the target object is not to be placed.

8. The inspection apparatus of claim 1,
   wherein the placing device has a heat pipe embedded therein, and
   when viewed from the top, one end of the heat pipe is located in a portion where the heat sink is not provided, and the other end of the heat pipe is located in a portion where the heat sink is provided.

9. An inspection method of inspecting a target object by using an inspection apparatus,
   wherein the inspection apparatus comprises:
   a placing device configured to place the target object thereon;
   a heater provided in the placing device; and
   a position adjusting mechanism configured to hold the placing device on which the target object is placed, and configured to perform a position adjustment between the target object placed on the placing device and a terminal to be brought into contact with the target object when an inspection of an electrical characteristic is performed,
   wherein the placing device is provided with a heat sink, including a plurality of column-shaped members which form prominences and depressions, at a portion of the placing device except a holding target portion thereof which is to be held by the position adjusting mechanism, each bottom surface of the column-shaped members being positioned at a same level as a bottom surface of the holding target portion, and
   wherein the inspection method comprises:
   adjusting a temperature of the placing device which is held by the position adjusting mechanism and holds the target object thereon;
   adjusting a position of the terminal with respect to the temperature-adjusted target object placed on the placing device and bringing the terminal into connect with the target object;
   separating the position adjusting mechanism and the placing device from each other while maintaining a state in which the target object and the terminal are in contact with each other; and
   inspecting the electrical characteristic while adjusting the temperature of the placing device in a state that the position adjusting mechanism and the placing device are separated from each other.

* * * * *